United States Patent [19]
Volk et al.

[11] Patent Number: 5,988,102
[45] Date of Patent: Nov. 23, 1999

[54] POP-UP TEMPERATURE INDICATING DEVICE

[75] Inventors: Steven John Volk; Gary Myrle Thompson, both of Turlock, Calif.

[73] Assignee: Volk Enterprises, Inc., Turlock, Calif.

[21] Appl. No.: 08/998,116

[22] Filed: Dec. 24, 1997

Related U.S. Application Data

[63] Continuation-in-part of application No. 08/743,754, Nov. 7, 1996, Pat. No. 5,799,606, which is a continuation of application No. 08/359,229, Dec. 19, 1994, abandoned.

[51] Int. Cl.⁶ .............................. G01K 11/06; G01K 1/02
[52] U.S. Cl. ........................ 116/218; 374/155; 374/160
[58] Field of Search ................... 116/216–218, 281, 116/283, 101, 106; 99/342; 374/155, 160; 252/408.1

[56] References Cited

U.S. PATENT DOCUMENTS

| | | | |
|---|---|---|---|
| 3,559,615 | 2/1971 | Kliewer | 116/218 |
| 3,682,130 | 8/1972 | Jeffers | 116/114.5 |
| 3,693,579 | 9/1972 | Kliewer | 116/218 |
| 3,713,416 | 1/1973 | Volk | 116/114.5 |
| 3,759,103 | 9/1973 | Volk | 73/358 |
| 4,082,000 | 4/1978 | Volk | 73/358 |
| 4,289,088 | 9/1981 | Scibelli | 374/160 |
| 4,421,053 | 12/1983 | Volk | 116/218 |
| 4,748,931 | 6/1988 | Volk | 116/218 |
| 5,323,730 | 6/1994 | Ou-Yang | 116/218 |
| 5,487,352 | 1/1996 | Williams et al. | 116/218 |
| 5,537,950 | 7/1996 | Ou-Yang | 116/218 |

*Primary Examiner*—Vit Miska
*Attorney, Agent, or Firm*—Julian Caplan; Flehr Hohbach Test Albritton & Herbert LLP

[57] ABSTRACT

A pop-up thermometer having an elongate housing formed with a longitudinally extending bore, a plurality of internal neck regions, and a plurality of internal cavities. The neck regions each having a minimum diameter portion and a neck locking surface extending outwardly from the minimum diameter portion of the neck. An indicator rod slidably disposed in the bore of the housing includes at least one stem stretch having a diameter less than the remainder of the bore and a stem locking surface extending outwardly from said stem stretch. A fusible material fills the internal cavities. When the fusible material is in solid form, the neck locking surface exerts a substantially downward directed force on said stem locking surface on the rod to resist upward movement of the rod relative to the housing.

4 Claims, 4 Drawing Sheets

U.S. Patent　　　Nov. 23, 1999　　　Sheet 1 of 4　　　5,988,102
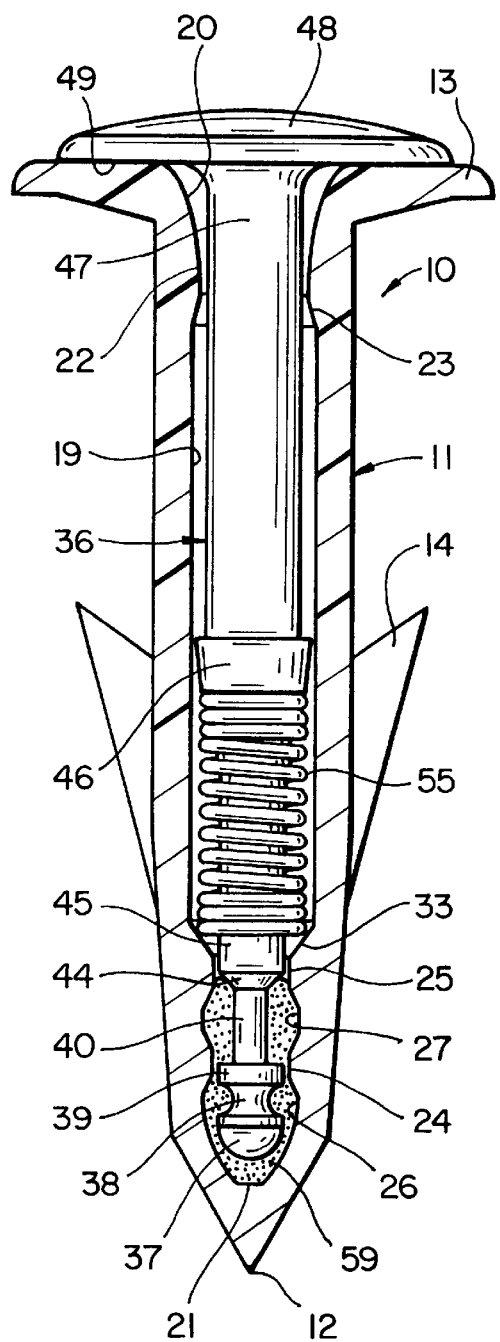
FIG_1
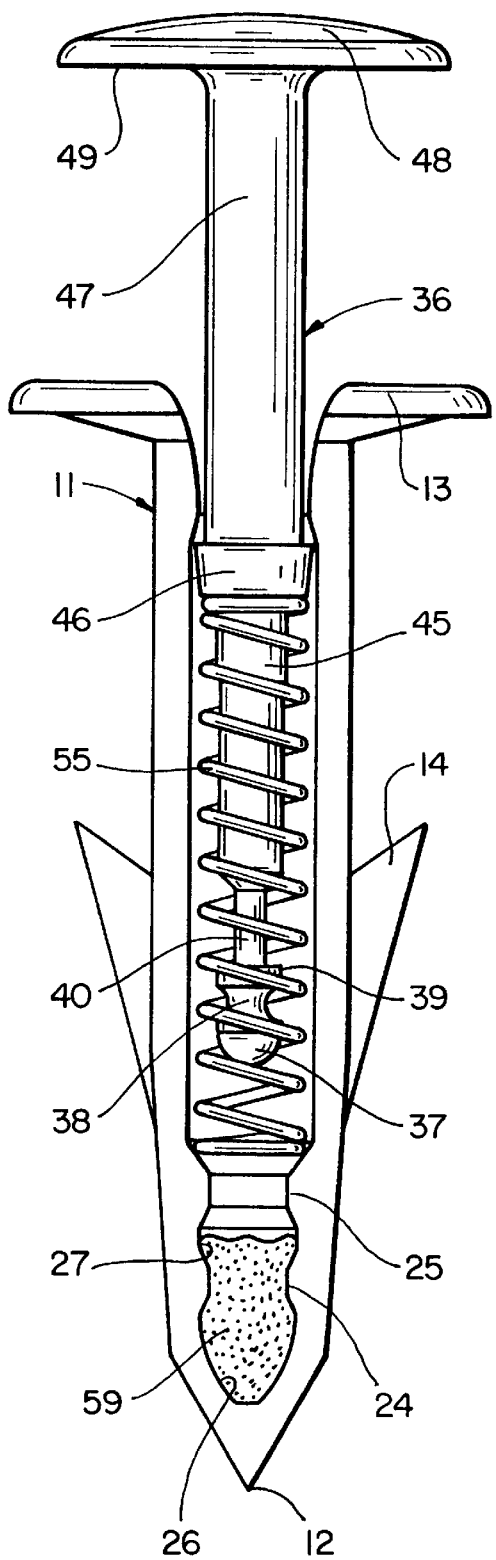
FIG_2

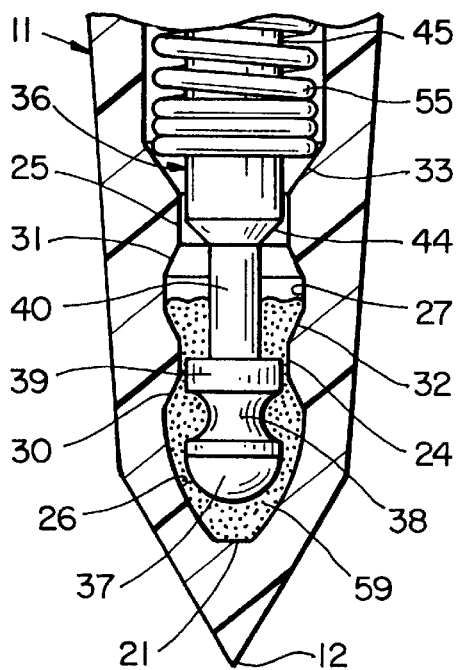
FIG_3
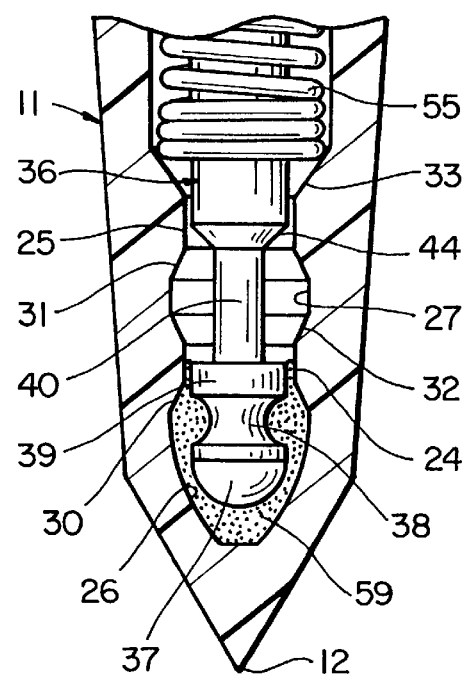
FIG_4
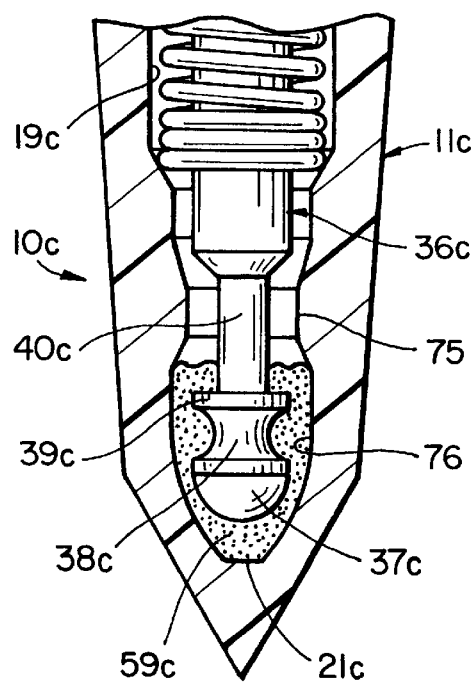
FIG_8

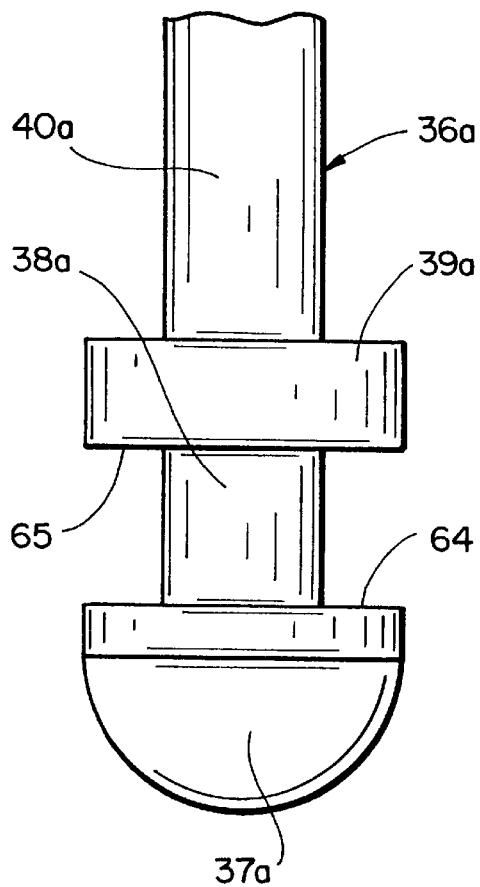
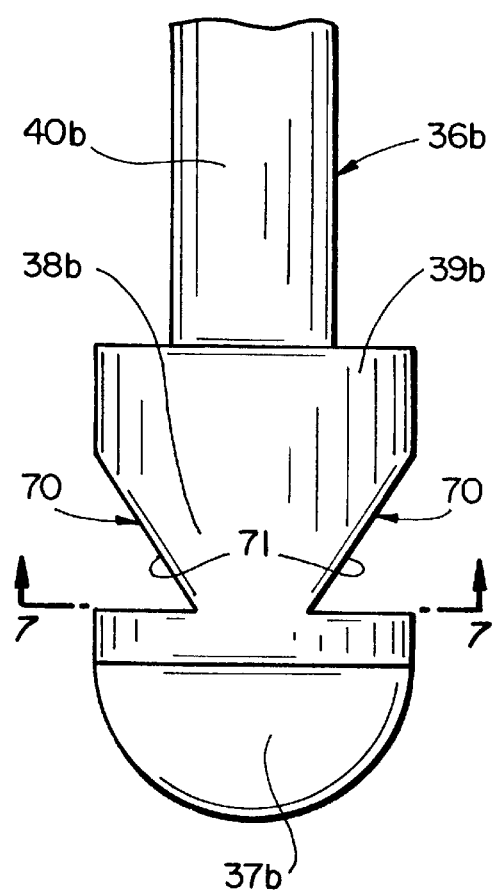
FIG_5    FIG_6
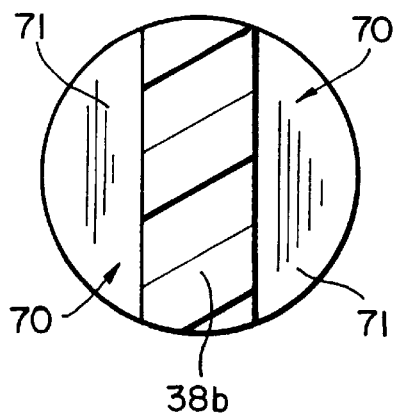
FIG_7

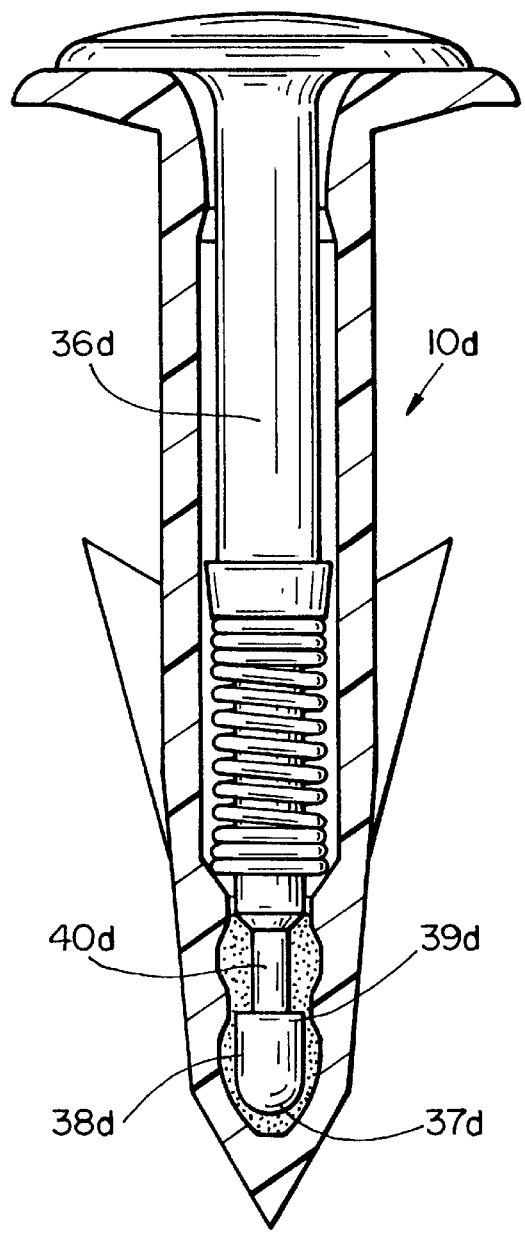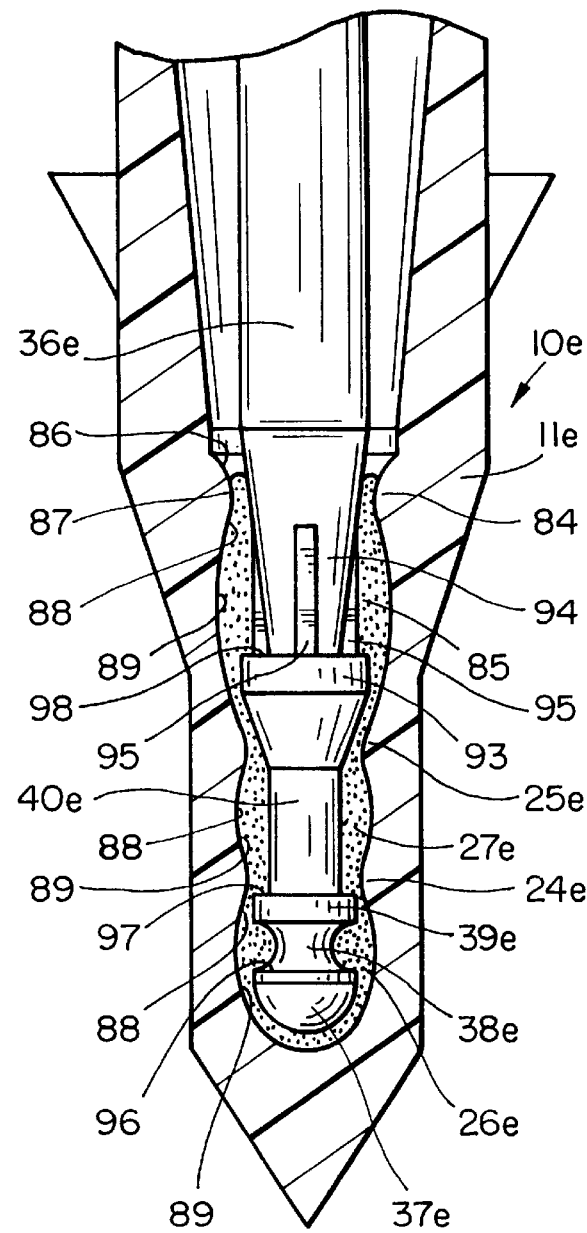
FIG_9  FIG_10

POP-UP TEMPERATURE INDICATING DEVICE

CROSS REFERENCE TO RELATED APPLICATIONS

This application in a continuation-in-part of U.S. Ser. No. 08/743,754, filed Nov. 7, 1996, now U.S. Pat. No. 5,799,606, which is a continuation of U.S. Ser. No. 08/359,229, filed Dec. 19, 1994, now abandoned the disclosure of which is hereby incorporated herein by reference.

BACKGROUND OF THE INVENTION

1. Field of the Invention

This invention relates in general to a temperature indicating device and, more particularly, to a pop-up temperature indicator for use in cooking foods.

2. Prior Art

Pop-up thermometers have been used for measuring internal temperatures when cooking meat, poultry and the like. Such thermometers typically include a barrel-shaped housing and an indicator rod retained in the barrel by a fusible material. When a predetermined temperature is reached, the fusible material softens, releasing the indicator rod from the barrel to provide a visual indication that the product is fully cooked. With the pop-up thermometer, a consumer may safely prepare meat or poultry without overcooking the product. U.S. Pat. No. 4,748,931 discloses one such pop-up thermometer.

To ensure the thermometer provides a reliable, accurate indication of the internal temperature of the product, the fusible material must securely retain the indicator rod within the housing until the thermometer has been heated to a predetermined temperature. If the indicator rod is allowed to creep slightly out of the housing during the cooking or heating process, a user may mistakenly interpret the thermometer as indicating that the product has been sufficiently cooked. During shipment of the temperature indicating devices, the indicator rod may creep from the housing if the devices are inadvertently heated. Even if the rod moves only a minimal distance relative to the housing, the thermometer may be rendered unusable.

Various factors may cause creep or premature extension of the indicator rod. During manufacture, an insufficient amount of fusible material may be added to the housing. For example, when the fusible material is supplied in pellet form, pellet breakage may result in pellet fragments being inserted in some thermometer housings. The traditional alloy materials used to retain the indicator rod in the housing are increasingly being replaced by organic materials. The organic materials generally have a lesser strength than the alloy materials, increasing the risk that the indicator rod will become displaced from the thermometer housing.

This invention provides a new and improved pop-up thermometer in which the indicator rod is securely retained in the thermometer housing until a predetermined temperature is attained. Premature creep or displacement of the indicator rod is avoided even when the thermometer is exposed to elevated temperatures during shipment or storage of the device, uses an organic material to retain the indicator rod in the housing, includes less than the desired amount of fusible material, etc. Even under adverse conditions, with the present invention the indicator rod is securely retained within the housing to provide a highly accurate, reliable thermometer for indicating when meat, poultry or other products have been heated to a predetermined internal temperature.

SUMMARY OF THE INVENTION

The pop-up thermometer of this invention is particularly suitable for determining the internal temperature of meat, poultry or other products. The thermometer generally includes an elongate housing formed with a longitudinally extending bore and an indicator rod. In one modification of the invention, the housing has first and second internal neck regions each having a lesser cross sectional opening than the remainder of the bore. The housing interior also includes a first internal cavity between the first neck region and the closed end of the bore and a second internal cavity between the first and second neck regions. The indicator rod is slidably disposed within the bore formed in the housing.

The indicator rod includes a front end portion and a first stem stretch extending upwardly from the front end portion. The first stem stretch terminates in a raised portion intermediate the first stem stretch and a second stem stretch which extends upwardly from the raised portion of the rod. The indicator rod also includes a rear end portion spaced from the front end of the rod. The first and second stem stretches have a lesser cross sectional diameter than the front end portion and the raised portion of the indicator rod, increasing the surface area of the forward portion of the indicator rod. When the indicator rod is inserted into the housing, the front end and first stem stretch are positioned in the first internal cavity while the second stem stretch is positioned in the second internal cavity. The temperature indicating device also includes means, such as a spring, for urging the indicator rod outwardly from the thermometer housing.

A fusible material which is solid under normal conditions and which softens at a predetermined elevated temperature substantially fills the first internal cavity. The solid fusible material engages the front end portion and at least portion of first stem stretch to retain the rod in the housing. Preferably, the fusible material substantially fills both cavities.

In another modification of the invention, the thermometer housing includes one internal neck region defining an internal cavity between the neck region and the closed end of the housing. The front end portion, raised portion, and stem stretches of the rod are positioned in the internal cavity. A fusible material fills the internal cavity at least to the lower edge of the second stem stretch, engaging the front end, first stem stretch and raised portion to retain the rod in the housing. Preferably, the internal cavity is substantially filled with fusible material.

In another modification of the invention, the housing includes a plurality of internal neck regions defining a plurality of internal cavities and the indicator rod includes at least one stem stretch. In still another modification of the invention, the housing includes first, second and third neck regions, and a first internal cavity between the closed end of the bore and the first neck region, a second internal cavity between the first neck region and the second neck region, and a third internal cavity between the second neck region and the third neck region. The indicator rod includes a first raised portion, a first stem stretch extending upwardly from the first raised portion, a second raised portion, a second stem stretch extending upwardly from the second raised portion, a third raised portion, and a third stem stretch extending upwardly from the third raised portion.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a sectional view of a pop-up temperature indicating device.

FIG. 2 is a schematic view of the temperature indicating device of FIG. 1, shown with indicator rod projecting from the thermometer housing.

FIGS. 3 and 4 are enlarged sectional views, partially broken away, of the temperature indicating device of FIG. 1, showing different amounts of fusible material within the temperature indicating device.

FIG. 5 is an enlarged side elevational view, partially broken away, of another embodiment of an indicator rod.

FIG. 6 is an enlarged side elevational view, partially broken away, of another embodiment of an indicator rod.

FIG. 7 is a cross sectional view taken along line 7—7 in FIG. 6.

FIG. 8 is an enlarged sectional view, partially broken away, of another embodiment of a temperature indicating device.

FIG. 9 is an enlarged sectional view, partially broken away, of yet another embodiment of a temperature indicating device.

FIG. 10 is an enlarged sectional view, partially broken away, of still another embodiment of a temperature indicating device.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A pop-up temperature indicating device 10 is shown particularly in FIGS. 1–4. The temperature indicating device or thermometer 10 generally includes an elongate thermometer housing 11 having a pointed tip 12 and a transversely extending flange 13 formed opposite the tip 12. The upper surface of the flange 13 is preferably substantially planar. A plurality of barbs 14 (here shown two in number) are formed on the exterior of the housing 11. The shape, size and number of exterior barbs 14 may vary as desired. The temperature indicating device 10 may be inserted into poultry, meat or other products by positioning the pointed tip 12 against the product and pressing the thermometer 10 inwardly until the underside of flange 13 engages the outer surface of the product. The barbs 14 securely hold the temperature indicating device 10 in place during storage, handling and cooking of the product.

The thermometer housing 11 is formed with a longitudinally extending bore 19 having an open end 20 proximate the flange 13 and a closed end 21 near the pointed tip 12. In the modification shown in FIGS. 1–4, the open end 20 has a greater cross sectional opening than the remainder of the bore to facilitate assembly of the temperature indicating device 10. The bore 19 tapers inwardly from the open end 20 to an annular restriction 22 which terminates in a downward outward slanted shoulder 23. The interior of the housing 11 includes a pair of spaced cylindrical neck regions 24 and 25 spaced inwardly from the restriction 22 and shoulder 23. The neck regions 24 and 25 define a first internal cavity 26 between the neck region 24 and the closed end 21 of the bore and a second internal cavity 27 between the two neck regions 24 and 25. The first and second neck regions 24 and 25 have a lesser cross sectional opening than the internal cavities 26 and 27 and the remainder of the bore 19.

As shown particularly in FIGS. 3 and 4, the housing 11 includes tapered shoulders 30 and 31 extending outwardly from the lower edges of the first and second neck regions 24 and 25. Tapered shoulders 32 and 33 extend outwardly from the neck regions 24 and 25 to the second internal cavity 27 and the interior wall of the bore 19, respectively. Although shoulders 30–33 are preferably tapered as shown in the Figures, if desired the shoulders may also have an orientation perpendicular to the longitudinal axis of the bore.

An indicator rod 36 is slidably positioned in the bore 19 of the thermometer housing 11. The indicator rod 36 generally includes an enlarged front end portion 37 and a first stem stretch 38 extending upwardly from the front end 37. A raised portion 39 separates the first stem stretch 38 from a second stem stretch 40. As is shown particularly in FIGS. 3 and 4, the first stem stretch 38 has a lesser cross sectional area than the adjacent portion of the front end 37, and the second stem stretch 40 has a lesser cross sectional area than the raised portion 39. As is described below in greater detail, the neck regions 24 and 25 and the internal cavities 26 and 27 of the housing 11 cooperate with the front end 37, raised portion 39 and stem stretches 38 and 40 of the indicator rod to retain the rod 36 in the housing.

The first stem stretch increases the surface area of the forward portion of the indicator rod 36. In the modification shown in FIGS. 1–4, the exterior surface of the first stem stretch 38 has a concave shape, with the stem stretch including a minimum diameter portion where the stem stretch has a minimum diameter and an upward-facing surface extending inwardly from the peripheral edge of the front end portion to the minimum diameter surface as is shown in the Figures. It is to be understood that the shape of stem stretch 38 may vary as desired. One advantage of the concave shape shown in FIGS. 1–4 is that it facilitates molding of the indicator stem. However, the shape of the first stem stretch may vary as desired. In this modification, the concave exterior of the first stem stretch 38 provides a recessed area which extends around the entire circumference of the rod 36. In other modifications of the invention, the first stem stretch may have a cross sectional shape which defines one or more recessed areas which extend less than the entire circumference of the stem stretch 38. Although a stem stretch 38 having a lesser cross sectional area than the front end of the rod provides increased security, in other modifications of the invention the housing 11 may be used with an indicator stem in which the first stem stretch is of the same size as the front end 37 and raised portion 39 of the rod. FIG. 9 shows an example of a temperature indicating device 10d in which the rod 36d has a first stem stretch 38d of the same size as the front end 37d and raised portions 39d, such that the indicator rod 36d includes only one stem stretch 40d having a diameter less than the diameter of the remainder of the stem.

In the modification shown in FIGS. 1–4, the front end 37 and the first stem stretch 38 are positioned in the first internal cavity 26, the second stem stretch 40 is positioned in the second cavity 27 and the raised portion 39 is generally aligned with the first neck region 24. As is shown particularly in FIG. 3, the indicator rod 36 is positioned in the bore with the front end 37 and the first stem stretch 38 being spaced inwardly in the bore from the first neck region 24, and the raised portion 39 is spaced inwardly from the second region 25. As used herein, the "first axial distance" is the axial distance between the surface of the first stem stretch 38 extending inwardly from the peripheral edge of the front end 37 and the first neck region 24, the "second axial distance" is the axial distance between the surface of the second stem stretch 40 extending inwardly from the peripheral edge of the raised portion 39 and the second neck region 25, the "first radial distance" is the radial distance between the first stem stretch 38 the wall of the first interior cavity 26, and the "second radial distance" is the radial distance between the second stem stretch 40 and the wall of the second interior cavity 27. As is shown for example in FIG. 1, the first radial distance is less than the first axial distance and the second radial distance is less than the second axial distance such that when the fusible material filling the cavities 26, 27 is in solid form, the shoulder extending outwardly from the neck region 24 exerts a substantially downward directed force on the inward extending surface of the first stem stretch 38 and the shoulder extending outwardly from the neck region 25 exerts a substantially downward directed force on the inward extending surface of second stem stretch 40. However, if desired the housing 11 and indicator rod 36 may be configured to provide a different relationship between the neck regions 24 and 25, internal cavities 26 and 27 and the indicator rod 36.

A tapered shoulder 44 extends outwardly from the second stem stretch 40 to an intermediate portion 45 of the indicator rod 36. The intermediate portion 45 terminates in an outward extending collar portion 46 which has a greater cross sectional diameter than the intermediate portion 45. Extending upwardly from the collar portion 46 is a rear end portion 47. The end portion 47 may have a lesser cross sectional diameter than the collar 46 as shown in FIGS. 1–4 or, if desired, the diameter of the end portion 47 may be equal to or greater than the diameter of the collar. The end portion 47 terminates in an enlarged cap portion 48 having a transversely extending underside 49. The underside 49 of the cap 48 is adapted to mate with the upper surface of the flange 13 on the housing 11. In the embodiment shown in FIGS. 1–4, the underside 49 of the cap is substantially planar. Instead of flange 13 and cap portion 48 having substantially planar surfaces, the upper surface of the flange 13 and the underside 49 of the cap may be formed with mating grooves and ridges or other complementary mating shapes if desired.

Directing attention particularly to FIGS. 1 and 2, the temperature indicating device 10 includes means for urging the indicator rod 36 from the fully inserted position shown in FIG. 1 to an extended position with the cap 48 spaced from the flange 13 of the housing 11 shown for example in FIG. 2. One such means is provided by a coiled spring 55 disposed around the intermediate portion 45 of the rod 36. The spring 55 is compressed between the slanted shoulder 33 of the housing 11 and the collar portion 46 of the indicator rod 36 when the indicator rod 36 is in the fully inserted position of FIG. 1. Once the temperature indicating device 10 has reached a predetermined elevated temperature, the spring 55 is allowed to expand, moving the collar 46 away from the shoulder 33 and causing the indicator rod to be displaced outwardly through the open end 20 of the housing 11. The spring 55 is one example of a suitable means for urging the indicator rod 36 to an extended position. However, other means may be substituted for the spring 55.

A fusible material 59 fills the first and second internal cavities 26 and 27 around the indicator rod 36. The fusible material 59 is in the form of a solid under normal conditions and is selected so that the material 59 softens or melts at the desired temperature for the particular application. The fusible material 59 may be provided by various materials, including alloys, metals, organic materials and the like. The solid material 59 engages front end portion 37, raised portion 39 and stem stretches 38 and 40 to securely retain the indicator rod 36 in the housing 11. The stem stretches 38 and 40 increases the surface area of the rod 36 engaged by the fusible material so that the rod may be more securely retained within the housing 11.

When the temperature indicating device is heated to a predetermined elevated temperature, the fusible material softens or melts, releasing the front end portion, raised portion and stem stretches of the indicator rod 36 from engagement with the solid material 59. The spring 55 is allowed to expand with the melting or softening of the fusible material, moving the collar 46 against the slanted shoulder 23 and pulling the front end 37 of the rod from the softened material 59. The outward displacement of the indicator rod provides a visual indication the thermometer has reached the desired temperature.

With the thermometer 10 shown in FIGS. 1 and 2, the fusible material 59 substantially fills both internal cavities 26 and 27. In general, substantially filling both internal cavities is a preferred configuration for the temperature indicating device 10. The indicator rod 36 is securely retained in the housing 11 until the fusible material 59 is heated to a predetermined elevated temperature. The interengagement between the solid material 59, neck regions 24 and 25, internal cavities 26 and 27 and the front end 37, raised portion 38 and stem stretches of the rod resists any premature upward creep or movement of the rod 36 as the thermometer is heated. The fusible material must be substantially softened or melted before the indicator rod 36 may be moved relative to the housing 11. The configuration of the housing 11 and indicator rod 36 shown in FIGS. 1–4 may be satisfactorily used with numerous fusible materials, including alloys and organic materials which often have a lesser strength than alloys.

While the configuration shown in FIGS. 1 and 2 is preferred, in many instances the thermometer 10 may be provided with a reduced amount of fusible material 59. The temperature indicating device 10 may be inadvertently filled with a smaller amount of fusible material as a result of various factors encountered during the manufacturing process. Alternatively, the amount of fusible material may be intentionally reduced to reduce the manufacturing cost of the thermometer 10.

Turning to FIG. 3, the fusible material 59 in the temperature indicating device 10 fills the second internal cavity 27 to the level of the second stem stretch 40. Even though the fusible material 59 does not completely fill both cavities, the solid material engages a substantial portion of the indicator rod 36 to securely retain the rod in the housing 11. Specifically, the fusible material 59 engages the front end 37, first stem stretch 38, raised portion 39 and a portion of the second stem stretch 40. The combination of the front end 37 and raised portion 39 and the reduced area stem stretches 38 and 40 ensure the fusible material 59 securely anchors the indicator rod 36 within the housing. The minimal space separating the first neck region 24 and the raised portion 39 of the rod 36 provides additional protection against slippage of the indicator rod 36 and solidified material 59.

Turning to FIG. 4, temperature indicating device 10 is shown having fusible material 59 substantially filling the first internal cavity 26. This condition may occur for example when a fragment of a pellet of fusible material instead of an entire pellet is inserted into the bore 19 during manufacture of the temperature indicating device 10. The solid material 59 engages the front end 37 and first stem stretch 38 to securely retain the indicator rod 36 in the housing 11. The engagement of the fusible material with the stem stretch 38 of the indicator rod 36 and the first neck region of the housing 11 substantially resists any slippage or movement of the indicator rod 36 relative to the housing 11 until the temperature indicating device is heated to a predetermined elevated temperature. In the modification shown in FIG. 4, the fusible material 59 also extends around the raised portion 39. However, it is to be understood that the indicator rod 36 may be securely retained within the housing 11 if the first internal cavity includes only enough fusible material to engage the front end 37 and first stem stretch 38 of the rod 36.

As is shown in FIGS. 1–4, the amount of fusible material employed with the temperature indicating device of the present invention may vary. It is to be understood that the amount of fusible material employed is not limited to the specific material levels shown in FIGS. 1–4. Moreover, if desired a greater amount of fusible material may be provided so that the material extends beyond the second neck stretch 24.

Another modification of a indicator rod 36a is shown in FIG. 5. Indicator rod 36a includes a front end portion 37a, a first stem stretch 38a, a raised portion 39a and a second stem stretch 40a. The exterior surface of the first stem stretch 38a is generally parallel to the longitudinal axis of the stem stretch 38a. The first stem stretch 38a has a cylindrical shape such that the exterior surface of the stem stretch 38a is substantially parallel to the longitudinal axis of the rod. First and second shoulders 64 and 65 extend outwardly from the first stem stretch 38a to the peripheral edge of the front end 37a and the peripheral edge of the raised portion 39a in a direction perpendicular to the axis of the rod 36a. The first stem stretch 38a substantially increases the surface area of the forward end of the rod which is engaged by the fusible material so that the indicator rod 36a may be securely held within the housing 11.

FIGS. 6 and 7 show another modification of an indicator rod 36b having a front end 37b, a first stem stretch 38b, a raised portion 39b and a second stem stretch 40b. In this modification of the invention, the first stem stretch 38b is formed with two recessed areas 70. The recessed areas 70 are defined by a tapered surface 71 which slants inwardly from the outer edge of the raised portion 39b to a point spaced inwardly of the outer edge of the front end portion 37b. The recessed areas 70 increase the surface area of the indicator rod 36b which may be engaged by the fusible material so that the indicating rod may be securely held within the housing until the temperature indicating device has been heated to the predetermined elevated temperature. Although two recessed portions 70 are shown in FIGS. 6 and 7, it is to be understood that the number of recessed portions formed in the first stem stretch may be increased or decreased as desired. The size and shape of the recessed portion 70 is subject to considerable variation. Moreover, if desired the recessed area 70 may extend around the entire circumference of the first stem stretch as in the previously described modifications.

Turning to FIG. 8, a temperature indicating device 10c having a modified housing 11c is depicted. The housing 11c includes one internal neck region 75 defining an internal cavity 76 between the closed end 21c of the bore 19c and the neck region 75. When the indicator rod 36c is fully inserted in the housing 11c, the front end portion 37c, raised portion 39c and stem stretches 38c and 40c are disposed in the internal cavity 76. The fusible material 59c preferably substantially fills the internal cavity 76. However, with some applications a lesser amount of material 59c may be used to retain the indicator rod in the housing 11c. The solidified fusible material 59c engages the front end 37c, first stem stretch 38c, raised portion 39c and second stem stretch 40c as shown in FIG. 8 to hold the indicator rod 36c within the housing 11c of the temperature indicating device 10c. As used herein, the "axial distance" is the axial distance between the surface of the second stem stretch 40c extending inwardly from the peripheral edge of the raised portion 39c and the neck region 75, and the "radial distance" is the radial distance between the second stem stretch 40c and the wall of the second interior cavity 76. As is shown in FIG. 8, the radial distance is less than the axial distance such that when the fusible material filling the cavity 76 is in solid form, the shoulder extending outwardly from the neck region 75 exerts a substantially downward direct force on the inward extending surface of the second stem stretch 40c. The increased surface area of stem stretches 38c and 40c ensures that the fusible material securely anchors the rod 36c in the housing 11c until the temperature indicating device has been heated to the predetermined elevated temperature.

FIG. 10 shows another modification of a temperature indicating device 10e constructed in accordance with the present invention. The housing 11e includes a first neck 24e defining a first internal cavity 26e, a second neck 25e defining a second internal cavity 27e, and a third neck 84 defining a third internal cavity 85. As shown in FIG. 10, the necks 24e, 25e and 84 are curved, having a portion 86 sloping inwardly to a minimum diameter portion 87 and a portion 88 sloping outwardly toward the maximum diameter portion 89 of the adjacent cavity. As with the previous embodiments, it is the outward sloping portion 88 which cooperates with the indicator rod 36e to retain the rod 36e in the housing 11e. Thus, the height of the minimum diameter portion 87 of the neck may be minimized to reduce the overall length of the housing. However, it is to be understood that in other modifications of the invention the necks 24e, 25e and 84 may be formed with the cylindrical portion and slanted shoulders shown for example in FIGS. 1–4.

In the modification of the invention shown in FIG. 10, the indicator rod 36e includes a front end portion 37e, a first stem stretch 38e, a raised portion 39e and a second stem stretch 40e. The second stem stretch 40e terminates in raised portion 93, and a third stem stretch 94 extends upwardly from the raised portion 93. The thickness of the indicator rod 36e increases at the raised portion 93, with the raised portion 93 having a greater cross sectional diameter than the raised portion 39e. The third stem stretch 94 has a conical shape, with the cross sectional diameter of the lower end of the stem stretch 94 being of approximately the same diameter as the second stem stretch 40e, and the cross sectional diameter of the upper end of the third stem stretch 94 being greater than that of the second stem stretch. Increasing the amount of material of this section of the indicator rod 36e strengthens the rod and increases the longitudinal stability of the rod 36e, facilitating the manufacture of the rod 36e and the insertion of the rod 36e into the housing 11e during assembly of the temperature indicating device.

The third stem stretch of the indicator rod is further reinforced by reinforcing ribs 95 formed on the exterior of the third stem stretch 94. In this embodiment, four reinforcing ribs 95 are uniformly distributed around the circumference of the stem stretch. However, it is to be understood that the number and position of the reinforcing ribs 95 may be varied within the scope of this invention. Although not shown, reinforcement ribs may also be positioned on the exterior of the first stem stretch 38e and/or the second stem stretch 40e to strengthen the front portion of the rod 36e.

The alternating stem stretches 38e, 40e, and 94 and raised portions 37e, 39e and 93 define upward-facing, outward extending surfaces 96, 97, and 98 generally located at the upper end of the front end portion 37e, the raised portion 39e and the raised portion 93. The portion 88 of the necks provides a neck locking surface, while the surfaces 96, 97 and 98 provide a stem locking surface. As with the previous embodiments, when the indicator rod 36e is positioned in the barrel of the housing 11e and the internal cavities 26e, 27e and 85 are filled with solidified fusible material, the outward sloped portion 88 of the first neck 24e exerts a substantially downward directed force on the outward extending surface 96, the portion 88 of the second neck 25e exerts a substantially downward directed force on the outward extending surface 97, and the outward sloped portion 88 of the third neck 84 exerts a substantially downward directed force on the outward extending surface 98. With this "triple lock" configuration, the indicator stem 36e will be securely held within the housing 11 until it is released when the fusible material softens at the predetermined temperature. With the three "locks" providing by the surface 96—first neck 24e, the surface 97—second neck 25e, and the surface 98—third neck 84, the temperature indicating device 10e is particularly suitable for use with organic fusible materials. Alternatively, the first cavity 26e or the first and second cavities 26e, 27e may be filled with an alloy material and the third cavity 85 filled with an organic material, with the organic material providing an isolating barrier between the alloy and the remainder of the bore of the housing 11e.

In other modifications of the invention, the housing 11e may be used with an indicator rod having only one or two stem stretches, providing a lesser number of outward extending surfaces. Similarly, the indicator rod 36e may be used with a housing 11e in which one or both of the first neck 24e and second neck 25e have been removed, resulting in only two internal cavities or one internal cavity.

The temperature indicating device 10 of the present invention is manufactured by separately forming the housing 11 and the indicator rod 36. The housing and rod are preferably formed by injection molding. A pellet of fusible material 59 is positioned in the bore 19 and the housing is heated to melt the fusible material. Alternatively, the fusible material may be deposited in the housing in liquid form. The spring 55 is inserted into the bore 19. The indicator rod 36 is pressed into the housing 11 until the cap 48 engages the flange 13. The indicator rod 36 is held in place while the temperature indicating device cools, allowing the fusible material to solidity. Once the fusible material has solidified, the temperature indicating device 10 may be prepared for shipment.

Except as set forth above, the modifications of FIGS. 5, 6–7, 8, 9 and 10 resemble those of the preceding modifications and the same reference numerals followed by the subscripts a–e, respectively, are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the Claims appended hereto and their equivalents.

What is claimed is:

1. A pop-up temperature indicating device comprising:

an elongate housing having a longitudinally extending bore formed therein having a closed end and an open end, said housing having a first neck region spaced from said closed end of said bore, a first internal cavity between said first neck region and said closed end of said bore, a second neck region spaced from said first neck region, a second internal cavity between said first neck region and said second neck region, a third neck region spaced from said second neck region, and a third internal cavity between said second neck region and said third neck region, said neck regions each having a minimum diameter portion having a lesser diameter than the remainder of said bore;

an indicator rod slidably positioned in said bore having a forward end positioned in said bore, said forward end of said rod having a first raised portion, a first stem stretch extending upwardly from said first raised portion, a second raised portion spaced from said first raised portion, a second stem stretch extending upwardly from said second raised portion, a third raised portion spaced from said second raised portion, and a third stem stretch extending upwardly from said third raised portion, said first stem stretch having a lesser diameter than said first raised portion, said second stem stretch having a lesser diameter than said second raised portion, and said third stem stretch having a lesser diameter than said third raised portion;

said first raised portion being positioned inwardly of said first neck region, said second raised portion being positioned inwardly of said second neck region, and said third raised portion being positioned inwardly of said third neck region when said rod is in a fully inserted position in said bore;

a spring urging said rod upwardly through said open end of said bore;

a fusible material substantially filling said internal cavities, said fusible material being in solid form under normal conditions to retain said rod in said housing and softening at a predetermined elevated temperature to release said rod for upward movement relative to said housing.

2. The temperature indicating device of claim 1 in which said rod includes a plurality of reinforcing ribs projecting outwardly from at least one of said stem stretches.

3. The temperature indicating device of claim 1 in which said fusible material is an alloy.

4. The temperature indicating device of claim 1 in which said fusible material is an organic material.

* * * * *